United States Patent
Byeon

(10) Patent No.: US 8,476,933 B2
(45) Date of Patent: Jul. 2, 2013

(54) RECEIVER CIRCUIT OF SEMICONDUCTOR APPARATUS AND METHOD FOR RECEIVING SIGNAL

(75) Inventor: Sang Yeon Byeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 13/217,391

(22) Filed: Aug. 25, 2011

(65) Prior Publication Data

US 2012/0105156 A1     May 3, 2012

(30) Foreign Application Priority Data

Oct. 28, 2010   (KR) .................. 10-2010-0106276

(51) Int. Cl.
   *G01R 19/00*   (2006.01)
   *G11C 11/34*   (2006.01)

(52) U.S. Cl.
   USPC .............. 327/51; 327/157; 327/52; 327/57; 365/185.21; 365/185.09

(58) Field of Classification Search
   USPC ............. 327/151–157, 50–55, 57, 197–203, 327/63–66; 365/63, 154, 185.09, 185.21, 365/233.11, 233
   See application file for complete search history.

(56) References Cited

U.S. PATENT DOCUMENTS

| | | | | |
|---|---|---|---|---|
| 5,258,958 A | * | 11/1993 | Iwahashi et al. | 365/185.21 |
| 5,455,802 A | * | 10/1995 | McClure | 365/233.11 |
| 5,848,011 A | * | 12/1998 | Muraoka et al. | 365/207 |
| 5,901,110 A | * | 5/1999 | Jang | 365/233.12 |
| 6,326,815 B1 | * | 12/2001 | Sim et al. | 327/57 |
| 6,703,871 B2 | * | 3/2004 | You et al. | 327/52 |
| 6,707,321 B2 | * | 3/2004 | Cho et al. | 327/51 |
| 7,629,817 B2 | * | 12/2009 | Nedovic et al. | 327/55 |

FOREIGN PATENT DOCUMENTS

| | | |
|---|---|---|
| KR | 1019910007236 A | 4/1991 |
| KR | 1020090053010 A | 5/2009 |

* cited by examiner

*Primary Examiner* — Vibol Tan
(74) *Attorney, Agent, or Firm* — William Park & Associates Patent Ltd.

(57) ABSTRACT

A receiver circuit of a semiconductor apparatus includes a first sense amplifier, a level restriction unit, and a second sense amplifier. The first sense amplifier amplifies an input signal in response to a clock signal and generates a first signal with a voltage swing between a first level and a second level. The level restriction unit receives the first signal and generates a correction signal with a voltage swing between the first level and a third level. The second sense amplifier amplifies the correction signal in response to the clock signal and generates a second signal with the voltage swing between the first level and the second level.

14 Claims, 4 Drawing Sheets

RECEIVER CIRCUIT OF SEMICONDUCTOR APPARATUS AND METHOD FOR RECEIVING SIGNAL

CROSS-REFERENCES TO RELATED APPLICATION

The present application claims priority under 35 U.S.C. §119(a) to Korean application number 10-2010-0106276, filed on Oct. 28, 2010 in the Korean Intellectual Property Office, and which is incorporated herein by reference in its entirety.

BACKGROUND

1. Technical Field

The present invention relates to a semiconductor apparatus, and more particularly, to a receiver circuit of a semiconductor apparatus.

2. Related Art

In general, a semiconductor apparatus includes a receiver circuit in order to improve the quality of an input signal or change the level of the input signal. The level may be changed, for example, from a current mode logic (CML) level to a complementary metal oxide semiconductor (CMOS) level. As the operation speed of a semiconductor apparatus operating in synchronization with a clock is increased, a receiver circuit using a sense amplifier has been extensively used instead of a general buffer circuit.

FIG. 1 is a diagram illustrating the configuration of a receiver circuit according to the known art. In FIG. 1, the receiver circuit includes a first sense amplifier 10, a second sense amplifier 20, and an SR latch 30. The first sense amplifier 10 receives input signals IN and INb and a clock signal CLK, and senses and amplifies the input signals IN and INb to generate first signals SIG1 and SIG1b. The second sense amplifier 20 receives the first signals SIG1 and SIG1b and the clock signal CLK, and senses and amplifies the first signals SIG1 and SIG1b to generate second signals SIG2 and SIG2b. The SR latch 30 receives the second signals SIG2 and SIG2b, which are output signals of the second sense amplifier 20, and generates an output signal OUT.

In FIG. 1, the two sense amplifiers are serially connected to each other to improve setup and hold time as compared with the case of receiving a signal using one sense amplifier. Since the first sense amplifier 10 and the second sense amplifier 20 perform a sense amplification operation in response to the input signals IN and INb and the clock signal CLK, the degree of delay of the output signal OUT is determined according to the input signals IN and INb and the clock signal CLK.

FIGS. 2A and 2B are signal diagrams illustrating the operation of the receiver circuit illustrated in FIG. 1. FIG. 2A illustrates the case in which the first sense amplifier 10 operates when the clock signal CLK reaches a high level after the input signal IN reaches a high level. In such a case, since the first sense amplifier 10 can accurately sense the level of the input signal IN when starting an amplification operation in response to the clock signal CLK, the input signal IN can be fully amplified by the first sense amplifier 10 between an external voltage VDD and a ground voltage VSS and be output as the first signals SIG1 and SIG1b. That is, the first signal SIG1 can be output as a signal with a level of the external voltage VDD, and the first signal SIG1b (a complementary signal) can be output as a signal with a level of the ground voltage VSS. A reference voltage Vref serves as a reference for determining whether the level of the input signal is a high level or a low level.

However, as illustrated in FIG. 2B, in the case in which the first sense amplifier 10 operates when the clock signal CLK reaches a high level at the rising edge of the input signal IN, the first sense amplifier 10 may not normally operate the amplification operation. That is, since the first sense amplifier 10 may not accurately sense the level of the input signal IN when starting the amplification operation, the input signal IN may not be fully amplified by the first sense amplifier 10 between the external voltage VDD and the ground voltage VSS. Thus, as illustrated in FIG. 2B, even if the first signal SIG1 is output with the level of the external voltage VDD, the first signal SIG1b (a complementary signal) may be output with a level higher than that of the ground voltage VSS. The input signal IN may not be fully amplified by the first sense amplifier 10 as the frequency of the clock signal CLK is increased.

The output time of the second signal SIG2 is different from the output time of the second signal SIG2b in the case in which the first signals SIG1 and SIG1b illustrated in FIG. 2A are amplified by the second sense amplifier 20 and in the case in which the first signals SIG1 and SIG1b illustrated in FIG. 2B are amplified by the second sense amplifier 20. That is, since the first signals SIG1 and SIG1b illustrated in FIG. 2A have been fully amplified with the external voltage VDD and the ground voltage VSS, the second sense amplifier 20 can sense and amplify the first signals SIG1 and SIG1b to output the second signals SIG2 and SIG2b at a normal timing. However, since the first signals SIG1 and SIG1b illustrated in FIG. 2B are not fully amplified with the external voltage VDD and the ground voltage VSS, the second sense amplifier 20 outputs the second signals SIG2 and SIG2b at a timing delayed with respect to the normal timing. Therefore, the difference occurs in the generation time points of the second signals SIG2 and SIG2b according to the first signals SIG1 and SIG1b illustrated in FIGS. 2A and 2B, so that a skew occurs between the output signals OUT output through the SR latch 30.

As described above, in the receiver circuit according to the known art a change occurs in the output time points of the output signals according to the input signals and the clock signal This may make it difficult to ensure accuracy of the operation of the receiver circuit and to improve a setup and hold times of a signal.

SUMMARY

A receiver circuit capable of reducing a change in the output time points of output signals is described herein.

In one embodiment of the present invention, a receiver circuit of a semiconductor apparatus includes a first sense amplifier configured to amplify an input signal in response to a clock signal and generate a first signal that swings between a first voltage level and a second voltage level. The receiver circuit also comprises a level restriction unit configured to receive the first signal and generate a correction signal that swings between the first voltage level and a third voltage level. The receiver circuit further comprises a second sense amplifier configured to amplify the correction signal in response to the clock signal and generate a second signal that swings between the first voltage level and the second voltage level.

In another embodiment of the present invention, a receiver circuit of a semiconductor apparatus includes a first sense amplifier configured to amplify an input signal in response to a clock signal and output a first signal, a level restriction unit configured to receive the first signal and generate a correction signal with a same voltage swing regardless of a voltage swing of the first signal, and a second sense amplifier configured to amplify the correction signal in response to the clock signal and output a second signal.

In another embodiment of the present invention a method for receiving a signal includes amplifying an input signal and generating a first signal pair, receiving the first signal pair and generating a correction signal pair with a same voltage difference regardless of a voltage difference of the first signal pair, and amplifying the correction signal pair and generating a second signal pair.

BRIEF DESCRIPTION OF THE DRAWINGS

Features, aspects, and embodiments are described in conjunction with the attached drawings, in which.

DETAILED DESCRIPTION

A receiver circuit of a semiconductor apparatus and a method for receiving a signal according to the present invention will be described in detail with reference to the accompanying drawings through exemplary embodiments.

Figure 3:
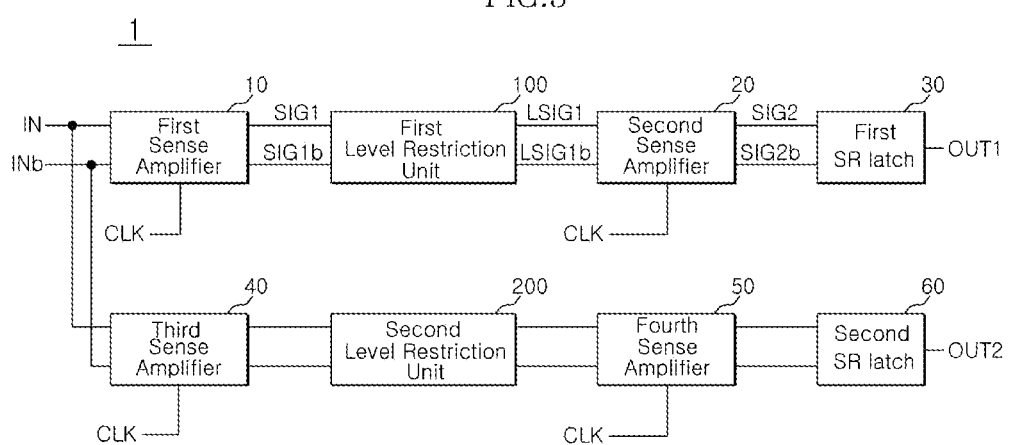
FIG. 3 is a diagram illustrating the configuration of a receiver circuit of a semiconductor apparatus according to an embodiment of the present invention.

FIG. 3 is a diagram illustrating the configuration of a receiver circuit 1 of a semiconductor apparatus according to an embodiment of the present invention. In FIG. 3, the receiver circuit 1 includes a first sense amplifier 10, a first level restriction unit 100, a second sense amplifier 20, and a first SR latch 30. The receiver circuit 1 also includes a third sense amplifier 40, a second level restriction unit 200, a fourth sense amplifier 50, and a second SR latch 60.

The first sense amplifier 10 is configured to receive input signals IN and INb and amplify the input signals IN and INb in response to a clock signal CLK. The first sense amplifier 10 is activated according to the clock signal CLK to amplify the input signals IN and INb with a voltage that swings between voltages with a first level and a second level. For example, the first sense amplifier 10 amplifies the input signals IN and INb with a signal that swings between an external voltage VDD and a ground voltage VSS. That is, the voltage with the first level may correspond to the external voltage VDD, and the voltage with the second level may correspond to the ground voltage VSS. The first sense amplifier 10 amplifies the input signals IN and INb to generate first signals SIG1 and SIG1b.

FIG. 3 illustrates an example in which the input signals IN and INb are provided as a pair. The first sense amplifier 10 can differentially amplify the input signals IN and INb input as a pair and output the first signals SIG1 and SIG1b. The first sense amplifier 10 has a configuration of a differential amplifier. Consequently, even if the input to the first sense amplifier 10 is a single input signal IN rather than a pair of signals, the first sense amplifier 10 can amplify the input signal IN to generate the first signals SIG1 and SIG1b.

The first level restriction unit 100 is configured to receive the first signals SIG1 and SIG1b and generate correction signals LSIG1 and LSIG1b. The first level restriction unit 100 has an amplification range smaller than that of the first sense amplifier 10. The first level restriction unit 100 is configured to amplify the first signals SIG1 and SIG1b with a voltage that swings at the first level and a third level, and generate the correction signals LSIG1 and LSIG1b. In an embodiment, the voltage with the third level is higher than the voltage with the second level. Whether the first signals SIG1 and SIG1b have been fully amplified as described with respect to FIG. 2A, or have not been fully amplified as described with respect to FIG. 2B, the first level restriction unit 100 generates the correction signals LSIG1 and LSIG1b that swing between the first level and the third level.

The first level restriction unit 100 is configured to compensate for the amplification operation of the first sense amplifier 10, which may be changed according to the input time points of the clock signal CLK and the input signals IN and INb. As described above, a change may occur in the levels of the first signals SIG1 and SIG1b, which are output from the first sense amplifier 10, according to the clock signal CLK and the input signals IN and INb. That is, the input signals IN and INb may be fully amplified as in FIG. 2A, or may not be fully amplified as in FIG. 2B. The first level restriction unit 100 can substantially generate the correction signals LSIG1 and LSIG1b that swing between the voltages of the first level and the third level.

The second sense amplifier 20 is configured to receive the correction signals LSIG1 and LSIG1b and amplify the correction signals LSIG1 and LSIG1b in response to the clock signal CLK. The second sense amplifier 20 is configured to be activated according to the clock signal CLK and amplify the correction signals LSIG1 and LSIG1b so that the amplified signals swing between the first level and the second level. The second sense amplifier 20 has a configuration of a differential amplifier similar to the first sense amplifier 10. The second sense amplifier 20 is configured to amplify the correction signals LSIG1 and LSIG1b and generate second signals SIG2 and SIG2b. Since the second sense amplifier 20 receives the correction signals LSIG1 and LSIG1b, which have been amplified with a constant voltage swing, from the first level restriction unit 100, the second signals SIG2 and SIG2b generated by the second sense amplifier 20 can be output after being amplified with the same level at substantially the same timing.

In FIG. 3, the receiver circuit 1 of the semiconductor apparatus according to the embodiment of the present invention may further include the first SR latch 30. The first SR latch 30 is configured to receive the second signals SIG2 and SIG2b and generate a first output signal OUT1. The first output signal OUT1 is transferred to an internal circuit of the semiconductor apparatus.

In FIG. 3, the receiver circuit 1 may further include the third sense amplifier 40, the second level restriction unit 200, the fourth sense amplifier 50, and the second SR latch 60. The third sense amplifier 40, the second level restriction unit 200, the fourth sense amplifier 50, and the second SR latch 60 correspond to the first sense amplifier 10, the first level restriction unit 100, the second sense amplifier 20, and the first SR latch 30, respectively, and are elements that may be additionally provided for a double data rate (DDR) operation of the semiconductor apparatus. One way may be by using a rising edge of the clock signal CLK for the circuitry comprising the first sense amplifier 10, the first level restriction unit 100, the second sense amplifier 20, and the first SR latch 30, and a falling edge of the clock signal CLK for the circuitry comprising the third sense amplifier 40, the second level restriction unit 200, the fourth sense amplifier 50, and the second SR latch 60. Through the additional configuration, the receiver circuit 1 can generate two output signals OUT1 and OUT2 from the same input signals IN and INb, thereby supporting the DDR operation of the semiconductor apparatus. The specific implementation for DDR operation, or other data rate operations, is design and/or implementation dependent.

Figure 4:
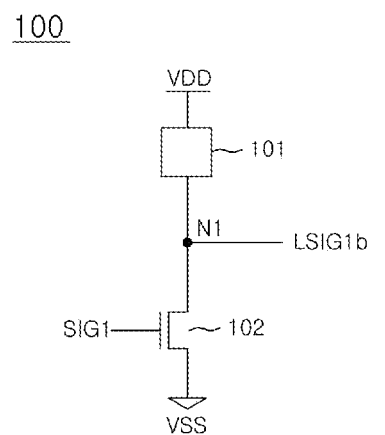
FIG. 4 is a diagram illustrating the configuration of the first level restriction unit illustrated in FIG. 3 according to an embodiment of the present invention.

FIG. 4 is a diagram illustrating the configuration of the first level restriction unit illustrated in FIG. 3 according to an embodiment of the invention. In FIG. 4, the first level restriction unit 100 includes a resistor section 101 and a MOS transistor 102. The resistor section 101 is coupled between an external voltage VDD terminal and a first node N1. The resistor section 101 may use any resistive element. In the example of FIG. 4, the MOS transistor 102 uses an NMOS transistor. The MOS transistor 102 is coupled between the first node N1 and a ground voltage VSS terminal and receives the first signal SIG1 through its gate.

When the first signal SIG1 at a low level is input to the first level restriction unit 100, the MOS transistor 102 is turned off and the external voltage VDD is applied to the first node N1. Accordingly, the correction signal LSIG1b with a level of the external voltage VDD is output. When the first signal SIG1 at a high level is input to the first level restriction unit 100, the MOS transistor 102 is turned on and the first node N1 is coupled to the ground voltage VSS terminal. Since the external voltage VDD is applied to the first node N1 through the resistor section 101, a voltage level of the first node N1 is higher than a level of the ground voltage VSS. Thus, the correction signal LSIG1b output from the first node N1 has a voltage higher than the ground voltage VSS when the correction signal LSIG1b is at a low voltage level.

Figure 1:
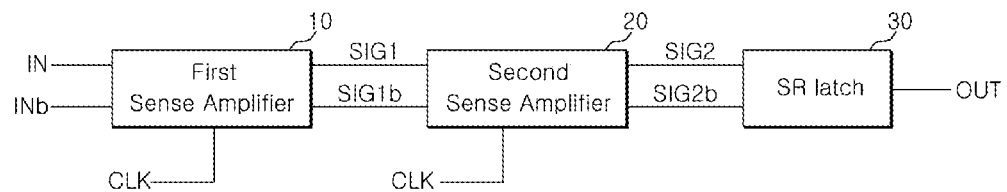
FIG. 1 is a diagram illustrating the configuration of a receiver circuit according to the known art.
Figure 2A:
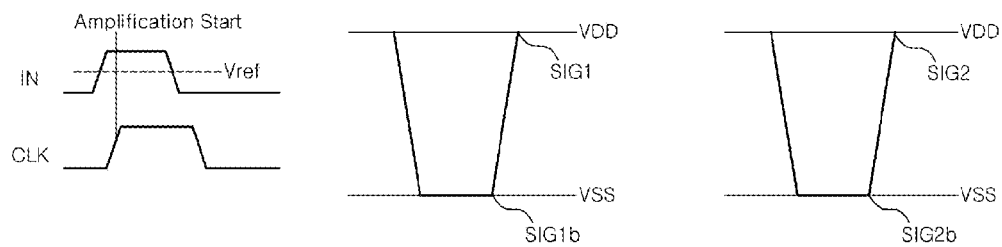
FIGS. 2A and 2B are signal diagrams illustrating the operation of the receiver circuit illustrated in FIG. 1.
Figure 2B:
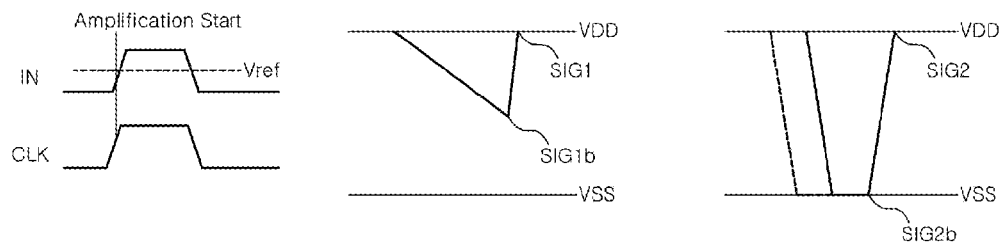

As a consequence, whether the first signals SIG1 and SIG1b are input as signals as shown in FIG. 2A, or as signals as shown in FIG. 2B, the first level restriction unit 100 can generate the correction signals LSIG1 and LSIG1b that swing fully from the first level to the third level. That is, when the first signals SIG1 and SIG1b are applied as signals with a large voltage difference therebetween, the first level restriction unit 100 can generate the correction signals LSIG1 and LSIG1b by reducing the voltage difference. When the first signals SIG1 and SIG1b are applied as signals with a small voltage difference therebetween, the first level restriction unit 100 can generate the correction signals LSIG1 and LSIG1b by increasing the voltage difference.

Figure 5:
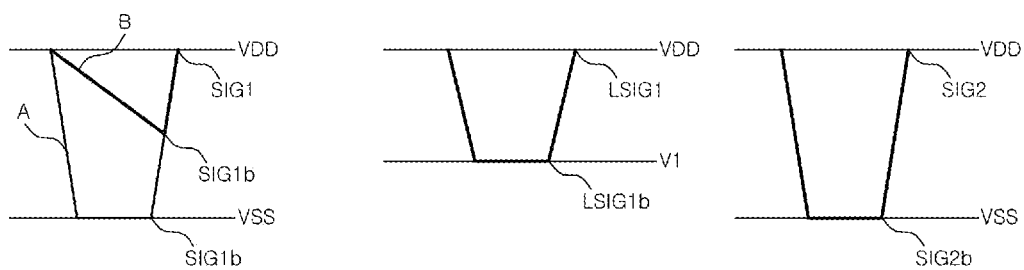
FIG. 5 is a signal waveform diagram illustrating operation of a receiver circuit of a semiconductor apparatus according to an embodiment of the present invention.

FIG. 5 is a signal waveform diagram illustrating the operation of the semiconductor apparatus according to an embodiment of the present invention. FIG. 5 illustrates the case A in which the first sense amplifier 10 operates when the clock signal CLK reaches a high level after the input signal IN reaches a high level and the case B in which the first sense amplifier 10 operates when the clock signal CLK reaches a high level at the rising edge of the input signal IN. In the case of A, since the first sense amplifier 10 can fully amplify the input signal IN, the first signals SIG1 and SIG1b may have levels of the external voltage VDD and the ground voltage VSS. In the case of B, since the first sense amplifier 10 cannot fully amplify the input signal IN, the first signals SIG1 and SIG1b may have low voltage levels higher than those of the ground voltage VSS.

Even if the first signals SIG1 and SIG1b in the cases of either A or B are received, the first level restriction unit 100 generates the correction signals LSIG1 and LSIG1b that swing between the first level and the third level V1. The second sense amplifier 20 amplifies the correction signals LSIG1 and LSIG1b, which are output from the first level restriction unit 100, to output the second signals SIG2 and SIG2b. Thus, the second signals SIG2 and SIG2b are output at substantially the same time point and output with substantially the same voltage.

Consequently, even if the amplification results of the first sense amplifier 10 are different from each other in the cases of A and B, the receiver circuit 1 according to the embodiment can generate the correction signals LSIG1 and LSIG1b with the same voltage by the first level restriction unit 100, thereby allowing the amplification results of the second sense amplifier 20 to substantially coincide with each other. That is, the receiver circuit 1 can output the output signals OUT1 and OUT2 at substantially the same time point regardless of the input time points of the input signals IN and INb and the clock signal CLK, thereby improving the setup and hold times of the output signals.

While certain embodiments have been described above, it will be understood to those skilled in the art that the embodiments described are by way of example only. Accordingly, the receiver circuit of the semiconductor apparatus and the method for receiving a signal described herein should not be limited based on the described embodiments. Rather, the receiver circuit of the semiconductor apparatus and the method for receiving a signal described herein should only be limited in light of the claims that follow when taken in conjunction with the above description and accompanying drawings.

What is claimed is:

1. A receiver circuit of a semiconductor apparatus, comprising:
a first sense amplifier configured to amplify an input signal in response to a clock signal and generate a first signal that swings between a first voltage level and a second voltage level;
a level restriction unit configured to receive the first signal and generate a correction signal that swings between the first voltage level and a third voltage level; and
a second sense amplifier configured to amplify the correction signal in response to the clock signal and generate a second signal that swings between the first voltage level and the second voltage level.

2. The receiver circuit according to claim 1, wherein the third voltage level is higher than the second voltage level, and the first voltage level is higher than the third voltage level.

3. The receiver circuit according to claim 1, wherein the level restriction unit comprises:
a resistive element coupled between a voltage terminal at the first voltage level and a first node; and
a MOS transistor coupled between the first node and a voltage terminal with the second voltage level, wherein the first signal is applied to a gate of the MOS transistor, and
wherein the correction signal is output from the first node.

4. The receiver circuit according to claim 1, wherein the first sense amplifier and the second sense amplifier are differential amplifiers.

5. A receiver circuit of a semiconductor apparatus, comprising:
a first sense amplifier configured to amplify an input signal in response to a clock signal and output a first signal;
a level restriction unit configured to receive the first signal and generate a correction signal with a same voltage swing regardless of a voltage swing of the first signal, wherein the level restriction unit has a smaller amplification range than the first sense amplifier; and
a second sense amplifier configured to amplify the correction signal in response to the clock signal and output a second signal.

6. The receiver circuit according to claim 5, wherein the second signal has a larger voltage swing than the correction signal.

7. The receiver circuit according to claim 5, wherein the level restriction unit comprises:
- a resistive device coupled between an external voltage terminal and a first node; and
- a MOS transistor coupled between the first node and a ground voltage terminal and receiving the first signal through a gate thereof, wherein the correction signal is output from the first node.

8. A method for receiving a signal, comprising:
- amplifying an input signal and generating a first signal pair in response to a clock signal;
- receiving the first signal pair and generating a correction signal pair with a same voltage difference regardless of a voltage difference of the first signal pair, wherein the correction signal pair is amplified with a smaller amplification range than the first signal pair; and
- amplifying the correction signal pair and generating a second signal pair in response to the clock signal.

9. The method according to claim 8, wherein a voltage difference of the second signal pair is larger than a voltage difference of the correction signal pair.

10. The method according to claim 8, wherein an operation for amplifying the input signal is a differential amplification operation.

11. The method according to claim 8, wherein an operation for amplifying the correction signal pair is a differential amplification operation.

12. The method according to claim 8, wherein the first signal pair is a differential signal pair.

13. The method according to claim 8, wherein the correction signal pair is a differential signal pair.

14. The method according to claim 8, wherein the second signal pair is a differential signal pair.

* * * * *